United States Patent
Mori et al.

(10) Patent No.: US 8,153,356 B2
(45) Date of Patent: Apr. 10, 2012

(54) METHOD FOR FORMING FILM PATTERN

(75) Inventors: Shosei Mori, Hiratsuka (JP); Masahiro Terada, Hatano (JP)

(73) Assignee: Canon Kabushiki Kaisha, Tokyo (JP)

( * ) Notice: Subject to any disclaimer, the term of this patent is extended or adjusted under 35 U.S.C. 154(b) by 674 days.

(21) Appl. No.: 12/351,127

(22) Filed: Jan. 9, 2009

(65) Prior Publication Data

US 2009/0181331 A1 Jul. 16, 2009

(30) Foreign Application Priority Data

Jan. 11, 2008 (JP) ................................ 2008-004390

(51) Int. Cl.
*G03F 7/26* (2006.01)
(52) U.S. Cl. ........................................ 430/325; 430/329
(58) Field of Classification Search .................. 430/322, 430/325, 329
See application file for complete search history.

(56) References Cited

U.S. PATENT DOCUMENTS

2005/0202613 A1* 9/2005 Pellens et al. ................. 438/167
2008/0241753 A1* 10/2008 Ando .......................... 430/287.1

FOREIGN PATENT DOCUMENTS

JP 2000-232091 A 8/2000

* cited by examiner

*Primary Examiner* — Kathleen Duda
(74) *Attorney, Agent, or Firm* — Canon U.S.A., Inc., IP Division

(57) ABSTRACT

A method for forming a film pattern includes applying a water-soluble photosensitive resin on a substrate, exposing the photosensitive resin to light, developing the photosensitive resin with a developer, after developing the photosensitive resin, depositing a material for the film pattern on the substrate, and, after depositing the material for the film pattern, removing photosensitive resin remaining on the substrate with a remover. The remover and the developer include the same solute, and a concentration of the solute in the remover is higher than that in the developer.

4 Claims, No Drawings

METHOD FOR FORMING FILM PATTERN

BACKGROUND OF THE INVENTION

1. Field of the Invention

The present invention generally relates to a method for forming a film pattern.

2. Description of the Related Art

Methods for forming a pattern in photolithography can be classified broadly into etching methods and liftoff methods. An etching method is a method for forming an objective element and circuit, whereby a film of a material for the element and circuit is formed on the substrate beforehand; then, a mask is formed thereon by carrying out patterning by use of a resist; unnecessary portions of the film are eliminated by etching through the mask; and, thereafter, the resist is eliminated. The etching method includes a dry etching method and a wet etching method, each of which may be suitably chosen.

In contrast, a liftoff method is a method whereby a film of a material for the element and circuit is formed on the resist, which had been applied on the substrate and was patterned; thereafter, unnecessary portions of the film on the resist are eliminated together with the resist.

The two methods for forming a pattern have their own merits and faults but generally, in terms of precision, the etching method may be more effective and, in terms of cost, the liftoff method may be more effective.

Whether a positive resist or a negative resist is used, it is possible to carry out either the liftoff method or the etching method therewith.

Positive resist is a material in which the portion exposed to light is dissolved and the unexposed portion remains insoluble. Negative resist is a material in which the portion exposed to light is cured and the pattern of the exposed portion remains. When patterning the resist, a developer is used and, when eliminating the unnecessary resist, a remover is used. In general, the components of the developer and remover are different.

A commonly used positive resist includes DNQ (diazonaphthoquinone) and a novolac resin.

First, a mechanism of development involving DNQ will be described. In the portion exposed to light, DNQ loses nitrogen and, via a keto-carbene intermediate, generates a ketene. This ketene reacts with moisture possessed by the novolac resin and is transformed into 3-indene carboxylic acid. This indene carboxylic acid is soluble in an alkaline aqueous solution and facilitates dissolution of the novolac resin in the alkaline aqueous solution. On the other hand, DNQ is hydrophobic and, when added to the novolac resin, it suppresses dissolution of the resin in the alkaline aqueous solution. This difference in solubility and the transition from dissolution suppression to dissolution enhancement enable positive patterns.

This basic concept can also be applied to chemically amplified resists.

Next, the mechanism of removal involving DNQ will be described. In the portion unexposed to light, DNQ is hydrophobic and is insoluble in alkali. Thus, it is necessary to use a solution containing as the main component an organic solvent which can dissolve the mixture of DNQ and a novolac resin. Therefore, the developer and remover for the positive resist cannot be made of the same material, due to different solubility requirements of the developing and removing steps.

Negative resist will be described with a cyclized rubber-bisazide resist as an example.

When a photosensitive aromatic bisazide is blended into a cyclized rubber and exposed to light, a crosslinking reaction occurs. When the light exposure exceeds a certain level, this crosslinking results in formation of a three-dimensional network structure and the cyclized rubber becomes difficult to dissolve in the organic solvent, thus providing a negative resist. From the cured portion (the portion exposed to light) and uncured portion (the portion unexposed to light), a pattern of the portion having reduced solubility in the organic solvent can be obtained. As for removal of the resist, use of a strongly polar organic solvent which can better dissolve the cured portion enables removal. Thus, in the case of a negative resist, the developer and remover are also not prepared from the same material.

SUMMARY OF THE INVENTION

In one embodiment in accordance with the present invention, a method for forming a film pattern is provided, the method including applying a water-soluble photosensitive resin on a substrate, exposing the photosensitive resin to light, developing the photosensitive resin with a developer, after developing the photosensitive resin, depositing a material for the film pattern on the substrate, and, after depositing the material for the film pattern, removing the photosensitive resin remaining on the substrate with a remover. The remover and developer include the same solute, and a concentration of the solute in the remover is higher than that in the developer.

Further features of the present invention will become apparent from the following description of exemplary embodiments.

DESCRIPTION OF THE EMBODIMENTS

In one embodiment in accordance with the present invention, a method is provided for forming a film pattern for developing a photosensitive resin using a developer and a remover. According to one aspect of the invention, the remover and developer include the same solute, and the concentration of the solute in the remover is higher than the concentration of the solute in the developer.

Furthermore, in one version the photosensitive resin is a negative resist comprising a carboxylic acid group which can exchange ions, such as an acrylic acid group.

Also, in one version, the developer and remover both comprise alkaline aqueous solutions, such as for example alkaline aqueous solutions comprising tetramethylammonium hydroxide (TMAH).

With regard to the concentration of TMAH in the solutions, in one version the TMAH concentration of the developer can be 0.238% or lower and the TMAH concentration of the remover can be 1.5% or higher.

Hereinafter, aspects of the present invention will be described in greater detail.

(1) Photosensitive Resin Material

In one embodiment in accordance with the present invention, the material to form a resin film may include a photosensitive resin. For example, the photosensitive resin used can be a water-soluble photosensitive resin. Here, the term water-soluble photosensitive resin refers to a photosensitive resin that can be developed in a development step, such as the development step described below, with a developer containing 50% by weight or more of water.

In one version, the photosensitive resin may be of a type containing a photosensitive group within the resin structure, or of a type containing a photosensitive agent mixed therein. Whichever resin is chosen, the resin may be suitably used by, for example, mixing a photoreaction initiator and a photoreaction inhibitor therein.

Also, the photosensitive resin may be either of a type (i.e., a negative type) wherein a coated film of the resin which is soluble in the developer becomes insoluble upon exposure to light, or of a type (i.e., a positive type) wherein a coated film of the resin which is insoluble in the developer becomes soluble upon exposure to light.

In one embodiment according to the present invention, the water-soluble photosensitive resin can be a resin which can exchange ions. For example, a resin having carboxylic acid groups can be used because it may easily form a well-defined pattern. Also, by using a water-soluble photosensitive resin, it may become easier to maintain a good work environment.

In one version, the composition of this water-soluble photosensitive resin includes a polymer component, a monomer component, a crosslinking agent, a surface active agent and a stabilizer. Also, in one version the developer may be a developer that can develop a pattern having a water content of 70% by weight or more, such as 90% by weight or more.

(2) Exposure, Development and Removal Steps

In the following, there will be described embodiments of application, drying, and exposure steps for the photosensitive resin, an embodiment of a development step wherein the exposed resist is developed, and an embodiment of a removal step wherein the resist remaining on the substrate after the development step is removed.

The application step is a step wherein the photosensitive resin is applied onto a substrate upon which the film pattern is to be formed. The application may be carried out by, for example, various printing methods (e.g., screen printing, offset printing and flexographic printing), a spinner method, a dipping method, a spray method, a stamp method, a rolling method, a slit coater method and an inkjet method.

The drying step is a step wherein the solvent contained in the coated film of the photosensitive resin is evaporated to dry the coated film, the photosensitive resin having been previously applied on the substrate in the application step. Drying of the coated film may be carried out at room temperature or, in order to shorten the drying time, drying can be carried out under heating. In one version, drying under heating can be conducted by using, for example, at least one of a windless oven, a drier and a hot plate. The drying conditions may vary depending on the formulation and amount of the composition for the formation of electrode and wiring, but generally can be carried out by keeping the substrate at, for example, a temperature of 50 to 120° C. for 1 to 30 minutes.

The exposure step is a step wherein the photosensitive resin film on the substrate, which has been dried in the previous drying step, is exposed to light according to a predetermined pattern, namely according to a film pattern to be produced (for example, in predetermined shapes corresponding to electrodes and wirings). In one version, the area of the photosensitive resin film that is to be exposed or not exposed to light can be selected in the same manner as that practiced in the usual mask formation by use of a photoresist.

The development step is a step wherein the photosensitive resin film is eliminated from the substrate, except for the portion left intact, where the film is that having been previously exposed to light in the exposure step. In the case of a negative resist of the present invention, the portion of the photosensitive resin film that has not been exposed to light is soluble in the developer, while the portion of the film that has been exposed to light becomes insoluble in the developer. Thus, development can be carried out by eliminating the unexposed portion of the photosensitive resin film by dissolution in the developer, which unexposed portion has not become insoluble (i.e., remains soluble).

In one version, even pure water can serve as a developer. However, in order to complete the development within a time period comparable to the conventional development time, in one version an alkaline aqueous solution such as an organic alkaline aqueous solution is used. For example, the alkaline aqueous solution may comprise a TMAH (tetramethylammonium hydroxide) aqueous solution.

According to one embodiment, when a TMAH aqueous solution is used as the developer, the concentration at the time of development may be such that there is substantially and even entirely no peeling of the photosensitive resin film, as well as such that there is substantially and even entirely no deterioration of precision of the pattern, and such that the development may be completed within a time period equivalent to the conventional development time.

The removal step is a step wherein the photosensitive resin film remaining on the substrate after development is eliminated (i.e., removed). For example, the removal step may be a step wherein the resist cured by exposure to light, and optionally a film deposited on this resist, are removed. In one version the remover may comprise, like the developer, an alkaline aqueous solution, such as an organic alkaline aqueous solution. For example, the remover may comprise a TMAH (tetramethylammonium hydroxide) aqueous solution.

Because the photosensitive resin film that remains on the substrate after the development has been cured, it cannot be removed with a remover having the same composition (e.g., the same chemical components in the same concentrations) as that of the developer. Even in the event the resist could be removed with the same solution used for the development of the film, the removal would take an excessive and unacceptably long time. Thus, according to one aspect of the invention, it has been surprisingly discovered that suitable removal of the resist can be achieved with a remover having a solution of higher concentration than the developer. For example, in one version, the remover and the developer may comprise the same solute, with the concentration of the solute in the remover being higher than that present in the developer. In one version, the remover and developer both comprise an alkaline aqueous solution having tetramethylammonium hydroxide (TMAH) as the solute. The concentration of TMAH in the remover and developer solutions may be determined, for example, with consideration of the relationships between the resist composition, exposure and development.

The removal method may include, for example, in addition to a dipping method and a paddle method, a method wherein an ultrasonic cleaner is used and a mechanical brushing method. A suitable removal method is one where excessive damage is not done to the film pattern.

(3) Method for Forming Film Pattern

An embodiment of a method for the formation of a film pattern will be described for cases where an etching method and a liftoff method are employed.

When an etching method is employed, a deposited film may be formed before application of the photosensitive resin. Thereafter, the photosensitive resin is applied, exposed, and developed, and then the deposited film may be etched using the photosensitive resin film as the mask to form the film pattern.

When a liftoff method is employed, a film may be deposited on the whole surface of the substrate after completion of the development of the resist. This may be done, for example, when formation of a deposited film is intended on an area wherefrom the resist has been removed, such as by the development of the photosensitive resin film previously applied on the substrate. In the film deposition step, any method may be used, including but not limited to methods such as a vapor deposition method, a sputtering method and a CVD method. In one version, the cross-sectional shape of the photosensitive resin pattern remaining on the substrate may be reverse tapered. A reverse tapered pattern of the photosensitive resin may be obtained more easily by use of a negative photosensitive resin. Thus, in one version, a negative photosensitive resin may be used when a liftoff method is employed.

In another version, when an anisotropic dry etching technique is used as the etching method, the cross-sectional shape of the photosensitive resin may be forward tapered, because when the cross-sectional shape of the photosensitive resin is reverse tapered the portion in the shade (e.g., about the edges) of the photosensitive resin pattern cannot be readily etched. Accordingly, in one version, in order to obtain a forward tapered cross-sectional shape of the photosensitive resin, a positive photosensitive resin may be used.

EXAMPLES

Example 1

The whole surface of a glass substrate (75 mm×75 mm×thickness 2.8 mm), was coated with a negative photosensitive resin (a polymer of methacrylic acid-methyl methacrylate-ethyl acrylate-n-butyl acrylate-azobisisobutyronitrile) by a spin coater and the film was dried on a hot plate at 100° C. for 10 minutes. The polymer of methacrylic acid-methyl methacrylate-ethyl acrylate-n-butyl acrylate-azobisisobutyronitrile is a resin which includes carboxylic acid groups.

Then, the area of the substrate where a pattern of photosensitive resin film was to be formed, was irradiated by an extra-high pressure mercury lamp (illumination intensity=8 mW/cm$^2$) using a photomask and was developed using a TMAH aqueous solution by a paddle method for 40 seconds.

The relationship between the TMAH concentration and the state of resist development is shown in Table 1.

TABLE 1

| TMAH concentration (%) | State of resist development |
|---|---|
| 0.119 | A |
| 0.238 | A |
| 0.476 | B |
| 0.595 | B |
| 1.00 | C |
| 1.19 | C |
| 1.50 | C |
| 2.00 | C |

The state of resist development was evaluated as follows:
A: developed without any problem;
B: precision of the pattern became worse (there were partial defects in the resin pattern);
C: even an unexposed resin pattern was peeled off.

Example 2

Using the method described in Example 1, a resin pattern was formed on a substrate, whereupon a silicon oxide film was deposited in 100 nm thickness by a plasma-CVD method.

Then, using a TMAH aqueous solution and treating by an ultrasonic method for 2 minutes, the resist was removed.

The relationship between the TMAH concentration and the state of resist removal is shown in Table 2.

TABLE 2

| TMAH concentration (%) | State of resist removal |
|---|---|
| 0.595 | C |
| 1.00 | C |
| 1.19 | B |
| 1.50 | A |
| 2.00 | A |
| 2.38 | A |
| 4.00 | A |

The state of resist removal was evaluated as follows:
A: removed without any residue;
B: residue remained;
C: the resin pattern remained almost as it was.

From the results of Tables 1 and 2, is can be seen that a suitable concentration of TMAH in the developer can be 0.238% or lower. A suitable concentration of TMAH in the remover can be 1.5% or higher.

Because the photosensitive resin is water-soluble, development is possible even when the TMAH concentration of the developer is 0% but, from a standpoint of development time, the TMAH concentration in the developer can be 0.119% or higher, and from a standpoint of precision of the pattern, the concentration can be 0.238% or lower.

The TMAH concentration in the remover for resist removal can be 1.5% or higher from a standpoint of residue removal, and can be 4% or lower from a standpoint of effects on the substrate.

In addition, it should be understood that the relationships between the TMAH concentration and the states of resist development and resist removal, as shown in Tables 1 and 2, can vary depending on, for example, the kind of the photosensitive resin used, the solute used for the developer, and the solute used for the remover.

For example, if a photosensitive resin, developer and remover are chosen so that the minimum concentration of the remover, whereat the resin can be removed substantially without any residue, is higher than the maximum concentration of the developer, whereat the development is performed substantially without any problem, embodiments of the present invention can be applied.

According to the examples above, the developer and remover can have the same component.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2008-004390, filed Jan. 11, 2008, which is hereby incorporated by reference herein in its entirety.

What is claimed is:
1. A method for forming a film pattern comprising:
applying a water-soluble photosensitive resin on a substrate;
exposing the photosensitive resin to light;
developing the photosensitive resin with a developer;
after developing the photosensitive resin, depositing a material for the film pattern on the substrate; and
after depositing the material for the film pattern, removing photosensitive resin remaining on the substrate with a remover, wherein the remover and the developer comprise alkaline aqueous solutions comprising tetramethylammonium hydroxide (TMAH), and wherein a concentration of TMAH in the developer is 0.119% or higher and 0.238% or lower, and a concentration of TMAH in the remover is 1.5% or higher and 4% or lower.

2. The method for forming a film pattern according to claim 1, wherein the photosensitive resin is a negative resist.

3. The method for forming a film pattern according to claim 2, wherein the negative resist comprises a carboxylic acid group which can exchange ions.

4. The method for forming a film pattern according to claim 3, wherein the negative resist comprises an acrylic acid group.

* * * * *